(12) United States Patent
Just et al.

(10) Patent No.: US 7,503,018 B2
(45) Date of Patent: Mar. 10, 2009

(54) METHOD OF SWITCHING A POWER SUPPLY OF VOLTAGE DOMAINS OF A SEMICONDUCTOR CIRCUIT, AND CORRESPONDING SEMICONDUCTOR CIRCUIT

(75) Inventors: Knut Just, Unterschleiβheim (DE); Thomas Krüger, Munich (DE); Thomas Möhring, Munich (DE)

(73) Assignee: Infineon Technologies AG, Munich (DE)

( * ) Notice: Subject to any disclaimer, the term of this patent is extended or adjusted under 35 U.S.C. 154(b) by 435 days.

(21) Appl. No.: 11/099,990

(22) Filed: Apr. 6, 2005

(65) Prior Publication Data

US 2005/0240891 A1    Oct. 27, 2005

(30) Foreign Application Priority Data

Apr. 6, 2004    (DE)    ......... 10 2004 016 920

(51) Int. Cl.
*G06F 17/50*    (2006.01)
(52) U.S. Cl. ............................. 716/1; 716/2
(58) Field of Classification Search ...... 716/1, 716/2, 18
See application file for complete search history.

(56) References Cited

U.S. PATENT DOCUMENTS

| 6,684,377 | B2 | | 1/2004 | Barney et al. | |
| 6,711,719 | B2 | * | 3/2004 | Cohn et al. | 716/2 |
| 6,883,152 | B2 | * | 4/2005 | Bednar et al. | 716/5 |
| 7,069,522 | B1 | * | 6/2006 | Sluss et al. | 716/1 |
| 7,117,457 | B2 | * | 10/2006 | Frenkil | 716/2 |
| 7,240,304 | B2 | * | 7/2007 | Dutta et al. | 716/4 |
| 7,246,335 | B2 | * | 7/2007 | Murgai et al. | 716/6 |
| 2002/0076851 | A1 | * | 6/2002 | Eden et al. | 438/106 |
| 2005/0050495 | A1 | * | 3/2005 | McGuffin et al. | 716/5 |

* cited by examiner

*Primary Examiner*—Jack Chiang
*Assistant Examiner*—Binh C Tat
(74) *Attorney, Agent, or Firm*—Brinks Hofer Gilson & Lione

(57) ABSTRACT

A method of switching a power supply of at least one voltage domain of a semiconductor circuit uses at least one microswitch, which is designed in standard cell design, to switch the power supply, so that the standard cell design method can be automated. Multiple microswitches can be disposed, evenly distributed, over those areas of the semiconductor circuit in which there is a voltage domain of which the power supply is to be switched. The microswitches of a voltage domain are defined by being switched by the same control signal. A semiconductor circuit to switch the power supply of the voltage domain includes microswitches, which can be constructed as transistors.

33 Claims, 2 Drawing Sheets

METHOD OF SWITCHING A POWER SUPPLY OF VOLTAGE DOMAINS OF A SEMICONDUCTOR CIRCUIT, AND CORRESPONDING SEMICONDUCTOR CIRCUIT

PRIORITY CLAIM

This application claims the benefit of priority to German Application 10 2004 016920.9 filed Apr. 6, 2004, which is hereby incorporated by reference in its entirety.

TECHNICAL FIELD

The present application relates to a semiconductor circuit which contains voltage domains. More specifically, the present application relates to a method of switching a power supply of voltage domains of a semiconductor circuit, and a semiconductor circuit which contains voltage domains of which the power supply can be switched off using microswitches.

BACKGROUND

Presently, the power supply of an area (called voltage domain below) of a semiconductor circuit is switched off by a switch outside the semiconductor circuit or by individual large switches on the semiconductor circuit. A voltage domain is understood to mean an area of the semiconductor circuit which has the same power supply with a uniform value of the voltage. The semiconductor circuit can then include one or more voltage domains.

When the power supply of a voltage domain of a semiconductor circuit is switched on or off by the switch outside the semiconductor circuit, a supply potential for the semiconductor circuit is connected via the switch to a supply pin or supply terminal of the semiconductor circuit. This means that, depending on the switch position, the supply pin is either connected to the supply potential or not. Additionally, a supply voltage line of the voltage domain is connected to the supply pin. When a control signal to control the power supply of the voltage domain is generated within the semiconductor circuit, a control pin of the semiconductor circuit carries the control signal to the switch outside the semiconductor circuit. In this case, the control signal is not be generated within the voltage domain to be switched, since this is sometimes switched off. In this case, two pins of the semiconductor circuit per voltage domain are used, so that the number of voltage domains in the case of a design in which the switch is outside the semiconductor circuit is greatly restricted. A further disadvantage of this design is that a connecting line for the control signal is laid through the semiconductor circuit to the control pin, and a supply voltage line is laid from the supply pin through the semiconductor circuit to the appropriate voltage domain, which results in a long line relative to the semiconductor circuit for the case that the voltage domain is a long way away from the appropriate pins of the semiconductor circuit. As well as the area requirement, a long supply voltage line results in a voltage drop, on the supply voltage line, of a magnitude corresponding to the line length. Additionally, with this design there is a supply voltage network for each voltage domain, but no global, regular supply voltage network which extends over the whole semiconductor circuit.

When the power supply of a voltage domain of the semiconductor circuit is switched on or off by the switch within the semiconductor circuit, a switch which is large relative to other components on the semiconductor circuit is used, to ensure that the switch can drive the currents which it switches without a great voltage drop. Particularly in the case of semiconductor circuits which are created using standard cell design, such a switch is outside those areas of the semiconductor circuit which are constructed using standard cells. Therefore, not only does a supply voltage line which carries the supply potential to the switch have a non-negligible length, but so does a supply voltage line which carries the supply potential which is switched through the switch to the appropriate voltage domain. Because of the length, a large voltage drop on these supply voltage lines occurs.

BRIEF SUMMARY

By way of introduction only, a method of switching a power supply of a voltage domain of a semiconductor circuit is presented. The method comprises switching the power supply using a switch which is designed in a standard cell design.

In another embodiment, a semiconductor circuit is presented. The semiconductor circuit comprises a voltage domain, a switchable power supply of the voltage domain, and a switch to switch the power supply of the voltage domain. The switch is designed as a standard cell of the semiconductor circuit.

The present invention is explained in more detail below, with reference to the attached drawings and on the basis of preferred embodiments.

DETAILED DESCRIPTION OF THE EMBODIMENTS

Figure 1:
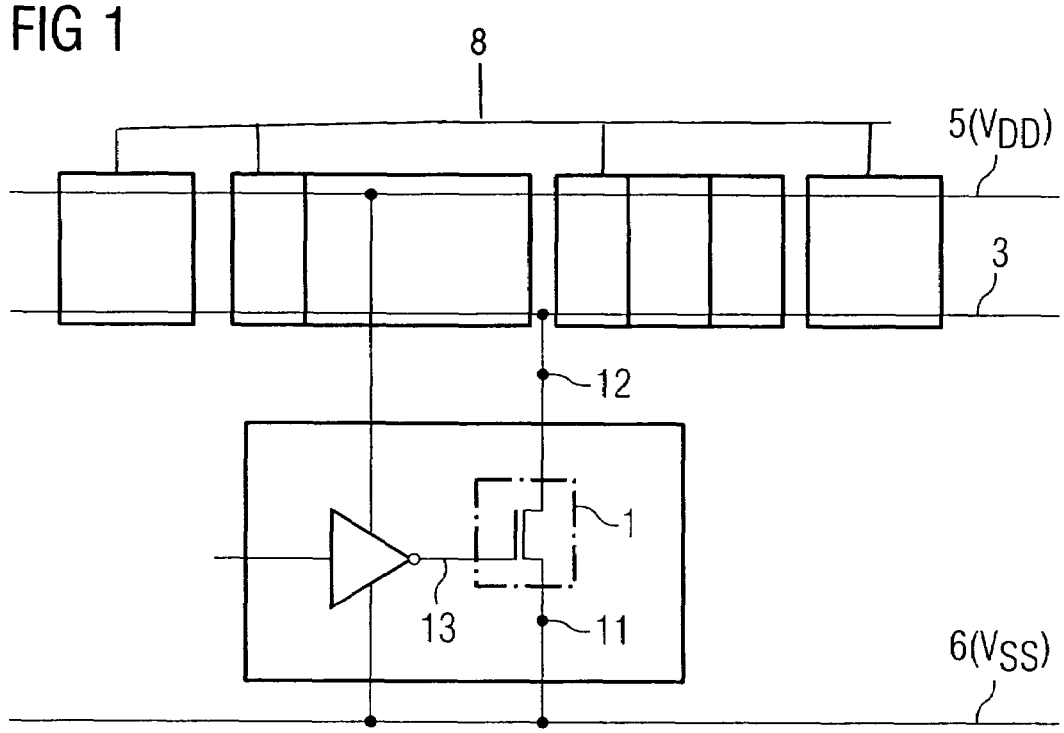
FIG. 1 shows schematically the method of functioning of a microswitch according to the invention to switch off a supply potential.

A method of switching a power supply of at least one voltage domain of a semiconductor circuit is provided. To switch the power supply, at least one switch which is designed in the standard cell design, and is called "microswitch", is used. Because the microswitch is designed in the standard cell design, a design of the microswitch fits well in a design method of a semiconductor circuit which is designed in the standard cell design. In other words, the design of the microswitch no longer has any special features, so that the design method can be easily automated. Additionally, a semiconductor circuit which is exclusively designed in the standard cell design can be designed to be more homogeneous and thus more area-saving than is the case with a semiconductor circuit for which the switch is not designed in the standard cell design. Moreover, as the dimensions of the microswitch correspond to the dimensions of a standard cell, the dimensions of the microswitch are significantly smaller than the dimensions of a switch which is used in the prior art.

The microswitch can be disposed within every voltage domain of which the power supply is to be switched. Evenly distributed multiple microswitches can be disposed over areas of the semiconductor circuit in which there is a voltage domain of which the power supply is to be switched. A supply voltage line which carries a supply potential of the semiconductor circuit from the microswitch to the corresponding voltage domain can be accordingly shortened and results in less resistance than an uneven distribution of the supply potential. Moreover, a load on the individual microswitch because of the current which it switches is less than if the microswitches were unevenly distributed over the voltage domain, which permits the microswitches to be smaller and/or formed in more area-saving dimensions. Evenly distributing the microswitches can also be better automated in a design method.

Each voltage domain can be supplied by a non-switchable supply voltage line with a first supply potential of the semiconductor circuit. Additionally, each voltage domain of which the power supply is to be switched can be supplied by a local supply voltage line with a second supply potential of the semiconductor circuit, the second supply potential being switched by means of microswitches to the local supply voltage line.

To switch the supply voltage of the voltage domain off, it is sufficient if one connection of the voltage domain to a supply potential is interrupted. Thus, one supply voltage line may be switchable and the other supply voltage line not switchable or more than one supply voltage line of the voltage domain may be switched by microswitches. As a voltage domain of which the power supply is to be switched is supplied by two supply voltage lines, one of which is switchable, a voltage domain of which the power supply is to be switched is structurally similar to a voltage domain which is supplied by two non-switchable supply voltage lines, so that a design method for these kinds of voltage domains is also similar.

Microswitches can be assigned to a voltage domain via a control signal to switch the power supply of this voltage domain. Those microswitches which are switched with the same control signal belong to the same voltage domain. Thus, those areas of the semiconductor circuit of which the power supply is controlled using the same control signal by which specified microswitches are switched, i.e. of which the power supply is switched on or off simultaneously on the basis of the value of the control signal, belong to the same voltage domain. Conversely, those areas of the semiconductor circuit of which the power supply is controlled using different control signals belong to different voltage domains.

Whereas according to the prior art areas are combined into a voltage domain by the same supply voltage line to be switched being connected to these areas, herein areas are combined into a voltage domain by the same control signal being wired to the areas and to the microswitches which are disposed there. Thus, wiring a line which carries a control signal is significantly more area-saving than wiring a supply voltage line.

Multiple local supply voltage lines of the same voltage domain can be connected to each other via a further line. This further line, which connects only local supply voltage lines of the same voltage domain, is another way of equalizing an unequal voltage or current requirement within the same voltage domain.

Each supply potential of the semiconductor circuit can be evenly distributed over the semiconductor circuit via non-switchable supply voltage lines. In this way, an optimum grid of a supply voltage network, which connects supply pins and microswitches, can be used without restriction by the various voltage domains, so that the least effect on the supply potential is achieved. Additionally, those areas or voltage domains in the semiconductor circuit of which the power supply is not to be switched can simply be connected to a required supply voltage. The design method can thus be simplified and the supply potential of which the delivery can be interrupted by the microswitches can simply be fed to the microswitches. In this case the microswitches are disposed near the corresponding non-switchable supply voltage lines. In one embodiment, the microswitches are disposed at crossing points at which the non-switchable supply voltage lines cross the local supply voltage lines of the voltage domains. In the case of voltage domains of which the power supply is not to be switched, instead of the microswitches, conducting contacts (vias), which connect the non-switchable supply voltage lines non-switchably to the local supply voltage lines, are disposed. This means that a connection to the power supply for a voltage domain of which the power supply is switchable is similar to a connection to the power supply for a voltage domain of which the power supply is not switchable, so that automated design methods can easily be implemented.

Adaptation to a power consumption of each voltage domain can take place via a number of the microswitches which switch the power supply of the corresponding voltage domain. In one embodiment, there are one or more standard sizes for the microswitches, which can be worked out, disposed and wired either by hand or automatically using a standard design method. Therefore, a single microswitch is not adapted individually to a power consumption, but the adaptation or dimensioning takes place advantageously via a corresponding number of the microswitches. This means that the larger the voltage domain is, or the higher the power consumption of the voltage domain is, the larger is the number of microswitches which are used to switch the power supply for the voltage domain.

A semiconductor circuit with a switchable power supply of a voltage domain of the semiconductor circuit is also provided. The semiconductor circuit includes at least one microswitch to switch the power supply of the voltage domain. The microswitch is designed as one standard cell of the semiconductor circuit, and can include one or more transistors or be constructed as a transistor. The design of a transistor with the dimensions of a standard cell can be integrated very well into the design method of a semiconductor circuit which is mainly designed in standard cell design.

A voltage domain of which the power supply is to be switched can be supplied by one or more local switchable supply voltage lines. In this case, a supply potential can be connected to each of these local supply voltage lines, each with one or more microswitches. However, it is also possible that this voltage domain is supplied by one or more first local switchable supply voltage lines and one or more second local switchable supply voltage lines. In this case, the same microswitch can switch both a first supply potential to a first local switchable supply voltage line and a second supply potential to a second local switchable supply voltage line. In another embodiment, two multiple microswitches can switch the corresponding supply potentials to the first and second local switchable supply voltage lines.

The microswitch is capable of switching two different supply potentials to two different lines, although it is controlled by only one control signal. A first terminal of the transistor is connected to a supply potential of the semiconductor circuit, and a second terminal of the transistor is connected to the local supply voltage line of the voltage domain. Depending on the value of a control signal, which is connected to a control terminal of the transistor, to switch the power supply, the supply potential is applied or not to the local supply voltage line. Connecting the power supply to the transistor offers a very simple mechanism to control or switch the power supply of a voltage domain.

If the supply potential to be switched is $V_{SS}$, the transistor is an NMOS (n-type Metal Oxide Semiconductor) or NFET (n-type Field Effect Transistor) transistor. On the other hand, the transistor may be a PMOS or PFET transistor, if the supply potential to be switched is $V_{DD}$. For the same current driver capability, a PMOS or PFET transistor uses twice or three times the area compared with a NMOS or NFET transistor. Generally, therefore, $V_{SS}$ is used as the supply potential to be switched.

The semiconductor circuit for which the power supply of at least one voltage domain of the semiconductor circuit is switchable is designed in standard cell design. In this way, the semiconductor circuit may be well suited for a design method which works with, for instance, automatic algorithms or scripts. This design method is thus easier to handle than a design method in which only part of the circuit is created in standard cell design, or in which no standard cells are used. The semiconductor circuit may also created by manual placement.

Although the number of microswitches is usually higher than the number of switches in the case of a semiconductor circuit according to the prior art, the area used to switch off the power supply as described herein is significantly less than in the case of the semiconductor circuit according to the prior art. This is because the microswitches can be created in standard cell design, so that on the one hand their dimensions are very small and on the other hand they can be designed together to be almost optimally area-saving, or integrated with the rest of the semiconductor circuit. Additionally, almost no additional area is required to carry firstly the supply voltage to the individual microswitch and secondly the supply voltage which the microswitch switches to the corresponding voltage domain.

An almost arbitrary number of voltage domains can be set up on the semiconductor circuit, without using additional pins or excessive additional area requirement, or having voltage dip. For a semiconductor circuit consisting of very many voltage domains, a significantly finer concept regarding switching off the supply voltage can be used, so that on average the supply voltage is switched off in a greater part of the semiconductor circuit than in a traditional semiconductor circuit consisting of few voltage domains. The semiconductor circuit thus consumes less power. While all semiconductor circuits of which the power is supplied by a battery, e.g. mobile telephones, laptops, etc may be designed, the method can be used to minimize the power consumption for other semiconductor circuits.

FIG. 1 shows a standard cell row in which standard cells 8 are present. The standard cell row is part of a voltage domain of which the power supply is to be switched by an NMOS transistor 1. The voltage domain has a first, non-switchable supply voltage line 5, which supplies $V_{DD}$ to the voltage domain, and a local, switchable supply voltage line 3, which supplies $V_{SS}$ to the voltage domain if the transistor 1 connects a second non-switchable supply voltage line 6 to the local switchable supply voltage line 3. The transistor 1 has three terminals 11, 12, 13. The second non-switchable voltage line 6 is connected to the voltage domain by a first terminal 11, and the local switchable supply voltage line 3 is connected to the voltage domain by a second terminal 12. If the value of a control signal which is connected to a control terminal 13 of the transistor 1 exceeds a specified level, the first 11 and second 12 terminals of the transistor 1 are connected to each other almost without resistance, so that the supply potential $V_{SS}$ is present at the local switchable supply voltage line 3 of the voltage domain, so that the power supply of the voltage domain is switched on. On the other hand, if the value of the control signal is below the specified level, the electrical connection between the first 11 and second 12 terminals is interrupted, so that the power supply of the voltage domain is switched off. The power supply of the voltage domain is therefore controlled by the control signal with the help of the transistor 1.

Figure 2:
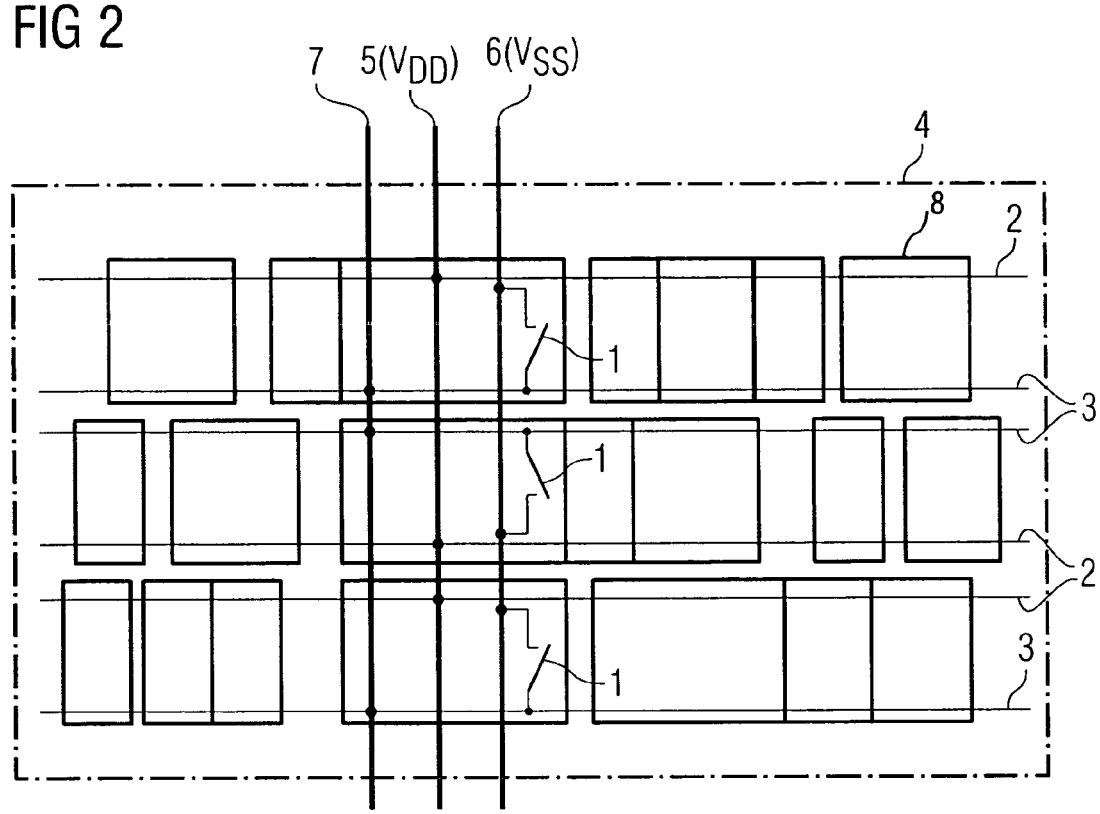
FIG. 2 shows schematically three rows of standard cells, each with a microswitch according to the invention.

FIG. 2 shows a voltage domain 4, which is constructed from three standard cell rows in which standard cells 8 are present. Each standard cell row has a microswitch 1, such as a transistor. A first global non-switchable supply voltage line 5, which carries $V_{DD}$, and a second global non-switchable supply voltage line 6, which carries $V_{SS}$, cross all three standard cell rows. In each standard cell row, there is a first local supply voltage line 2, which is connected non-switchably to the first global non-switchable supply voltage line 5 and supplies $V_{DD}$ non-switchably to the corresponding standard cell row of the voltage domain 4 through it. Additionally, in each standard cell row there is a second local supply voltage line 3, which in each case is connected via a microswitch 1 to the second global non-switchable supply voltage line 6. Because it is connected to the microswitch 1, every second local supply voltage line 3 can be switched by the corresponding microswitch 1, so that the supply voltage of the voltage domain 4 can be switched on and off by the three microswitches shown in FIG. 2. The control terminals 13 of the three microswitches 1 are connected to the same control signal (not shown), so that the three microswitches 1 are either all conducting or all non-conducting. It should be noted that the definition of a voltage domain 4 is that all the microswitches 1 which are assigned to it are controlled by the same control signal, so that in the voltage domain 4 either all the microswitches 1 which are assigned to it supply $V_{SS}$ to the voltage domain 4, or all microswitches 1 interrupt the power supply of the voltage domain 4.

By using a further local supply voltage line 7, all second local supply voltage lines 3 of the voltage domain 4 are connected to each other. In this way, the voltage load or power consumption which can occur in particular standard cells of the voltage domain 4 at particular instants, and thus loads a particular second local supply voltage line 3, is balanced by the other second local supply voltage line 3 of the voltage domain 4. As the second local supply voltage lines 3 of the voltage domain 4 are connected by the further local supply voltage line 7, the microswitches 1 may be designed using an average load over all microswitches 1 of the voltage domain rather than a peak load on the microswitches 1. This permits the microswitches 1 to be designed to be relatively small.

Let it be assumed that at a particular instant the second local supply voltage line 3 in the top standard cell row of FIG. 2 is loaded above average, e.g. because multiple components are drawing current simultaneously. Without the existence of the further supply voltage line 7, the microswitch 1 in the top standard cell row would also be loaded above average, so that it would have to be designed to be large corresponding to this load. However, because of the further supply voltage line 7, the load on the second local supply voltage line 3 in the top standard cell row is also divided between the two second local supply voltage lines 3 in the second and third standard cell rows, and thus between the two microswitches 1 in the second and third standard cell rows. Thus, a voltage or current load on the microswitch 1 in the top standard cell row is absorbed by the two other microswitches 1 in the second and third standard cell rows, so that all three microswitches 1 can be designed to be significantly smaller and/or more space-saving than if the further supply voltage line 7 was not present. Additionally, the further supply voltage line 7 ensures that a smaller voltage drop occurs than if the further supply voltage line 7 was not present, since, for instance, a voltage drop on the second supply voltage line 3 in the top standard cell row is absorbed by the second supply voltage lines 3 in the lower standard cell rows.

It should be pointed out that the structure of the second standard cell row is mirrored on a horizontal axis compared with the structure of the first and third standard cell rows. This is a known method of standard cell design, so that two adjacent standard cell rows can adjoin each other more closely.

Obviously, a voltage domain can be constructed of more or fewer than three standard cell rows. Additionally, a voltage domain can be supplied by multiple first and second supply voltage lines 5, 6. Additionally, the second local supply voltage lines 3 of a voltage domain can be connected by multiple further local supply voltage lines 7, or only specified second local supply voltage lines can be connected by one or more further supply voltage lines 7. Similarly, the standard cells and microswitches can be arranged in vertical instead of horizontal rows.

The number of further supply voltage lines and placement of the microswitches can be decided automatically on the basis of the assumed load on individual areas of the voltage domain in an automated design method.

The circuit and method can be used with mobile equipment such as mobile telephones, e.g. for a GSM baseband semiconductor circuit. The restricted quantity of energy of a mobile device which is equipped with a battery requires a sophisticated switching-off concept. The whole semiconductor circuit is divided into multiple voltage domains, which can be switched off, i.e. disconnected from the power supply, individually depending on the use of the voltage domains in different operating modes of the semiconductor circuit.

Switching off the power supply of voltage domains at times when the voltage domains are not being operated reduces the power requirement of the semiconductor circuit drastically, and correspondingly increases the standby time of the semiconductor circuit and thus of the mobile device which is equipped with the battery.

It is therefore intended that the foregoing detailed description be regarded as illustrative rather than limiting, and that it be understood that it is the following claims, including all equivalents, that are intended to define the spirit and scope of this invention. Nor is anything in the foregoing description intended to disavow scope of the invention as claimed or any equivalents thereof.

We claim:

1. A method of switching a first power supply of a first voltage domain and a second power supply of a second voltage domain of a semiconductor circuit, the method comprising:
    switching the first power supply using a plurality of first switches which are designed in a standard cell design and the plurality of first switches being switched in accordance with a same first control signal;
    switching the second power supply using a plurality of second switches which are designed in a standard cell design and the plurality of second switches being switched in accordance with a same second control signal;
    wherein a power consumption of the first voltage domain is higher than a power consumption of the second voltage domain;
    wherein a number of the first switches to switch the first power supply of the first voltage domain is larger than a number of the second switches to switch the second power supply of the second voltage domain, and
    wherein the semiconductor circuit includes a plurality of voltage domains including the first and second voltage domain, and every voltage domain of which the power supply is to be switched is supplied by:
        a first local switchable supply voltage line to which a first supply potential of the semiconductor circuit is to be switched using a switch, or
        a first local switchable supply voltage line and a second local switchable supply voltage line, in which case a first supply potential is switched to the first local switchable supply voltage line using the switch and a second supply potential is switched to the second local switchable supply voltage line using the same switch.

2. The method according to claim 1, wherein the semiconductor circuit includes a plurality of voltage domains including the first and second voltage domain, and a switch configured to switch the power supply is disposed within each voltage domain of which the power supply is to be switched.

3. The method according to claim 1, wherein the plurality of first switches are evenly distributed over areas of the semiconductor circuit in which the first voltage domain of which the power supply is to be switched.

4. The method according to claim 1, wherein each voltage domain of the first and second voltage domain is supplied by a non-switchable supply voltage line to which a supply potential of the semiconductor circuit can be fed.

5. The method according to claim 1, wherein the semiconductor circuit includes a plurality of voltage domains including the first and second voltage domain, end each voltage domain of which the power supply is to be switched is supplied by a local switchable supply voltage line to which a first supply potential of the semiconductor circuit can be switched using a switch.

6. The method according to claim 1, wherein the semiconductor circuit includes a plurality of voltage domains including the first and second voltage domain, and each voltage domain is supplied by a non-switchable supply voltage line to which a first supply potential of the semiconductor circuit can be fed, and each voltage domain of which the supply voltage can be switched is supplied by a local switchable supply voltage Tine to which a second supply potential of the semiconductor circuit can be switched using a switch.

7. The method according to claim 5, wherein a second supply potential of the semiconductor circuit is fed to a first terminal of the switch, a second terminal of the switch is connected to the local switchable supply voltage line of the voltage domain, and an electrical connection between the first and second terminals is interrupted by the switch only if a level of a control terminal of the switch is below or above a predefined value.

8. The method according to claim 7, wherein the control terminal of each switch being connected to a control signal to switch the power supply of the voltage domain so that the same value is applied to each control terminal.

9. The method according to claim 8, wherein the local supply voltage lines of the voltage domain are connected to each other via a further line.

10. The method according to claim 1, wherein each supply potential of the semiconductor circuit is distributed evenly over the semiconductor circuit via non-switchable supply voltage lines.

11. The method according to claim 1, wherein each first switch includes a transistor.

12. The method according to claim 1, wherein the first supply potential is fed to a first terminal of the switch, a second terminal of the switch is connected to the second local switchable supply voltage line, and a control signal to switch the power supply of the voltage domain is applied to a control terminal of the switch.

13. The method according to claim 1, wherein the first local switchable supply voltage lines to which the first supply potential is to be switched by switches that are connected to the same control signal are connected to each other via a further line.

14. The method according to claim 1, wherein each first switch is a NMOS or NFET transistor.

15. The method according to claim 1, wherein each first switch is a PMOS or PFET transistor.

16. The method according to claim 1, wherein non-switchable lines to which a supply potential of the semiconductor circuit can be fed are disposed evenly over the semiconductor circuit.

17. The method according to claim 1, wherein two rows or columns of the semiconductor circuit, of which the first power supply in each case is to be switched by a first switch, and which are arranged adjacently in the semiconductor circuit, are arranged in mirror symmetry to each other regarding supply voltage lines and regarding the first switch.

18. The method according to claim 1, wherein the semiconductor circuit includes standard cells, the first voltage domain and the first switch being constructed of the standard cells.

19. The method according to claim 18, wherein the standard cells are arranged in a row or column, each of the row or column being connected to a first supply potential and a second supply potential of the semiconductor circuit.

20. The method according to claim 1, wherein the semiconductor circuit Includes a plurality of voltage domains including the first and second voltage domain, and further comprising designing the semiconductor circuit such that adaptation to power consumption of each voltage domain takes place via the number of switches which switch the power supply of the corresponding voltage domain.

21. A semiconductor circuit comprising:
a first voltage domain;
a first switchable power supply of the first voltage domain;
a plurality of first switches to switch the first power supply of the first voltage domain, each first switch being designed as a standard cell of the semiconductor circuit and being switched in accordance with a same first control signal;
a second voltage domain;
a second switchable power supply of the second voltage domain;
a plurality of second switches to switch the second power supply of the second first voltage domain, each second switch being designed as a standard cell of the semiconductor circuit and being switched in accordance with a same second control signal;
wherein a power consumption of the first voltage domain is higher than a power consumption of the second voltage domain;
wherein a number of the first switches to switch the first power supply of the first voltage domain is larger than a number of the second switches to switch the second power supply of the second voltage domain, and
a plurality of voltage domains including the first and second voltage domain, and every voltage domain of which the power supply is to be switched is supplied by:
a first local switchable supply voltage line to which a first supply potential of the semiconductor circuit is to be switched using a switch, or
a first local switchable supply voltage line and a second local switchable supply voltage line, in which case a first supply potential is switched to the first local switchable supply voltage line using the switch and a second supply potential is switched to the second local switchable supply voltage line using the same switch.

22. The semiconductor circuit according to claim 21, wherein the semiconductor circuit includes a plurality of voltage domains including the first and second voltage domain, and a switch configured to switch the power supply is disposed within each voltage domain of which the power supply is to be switched.

23. The semiconductor circuit according to claim 21, wherein the plurality of first switches are evenly distributed in areas of the semiconductor circuit in which the first voltage domain of which the power supply is to be switched.

24. The semiconductor circuit according to claim 21, wherein the semiconductor circuit includes a plurality of voltage domains including the first and second voltage domain, and in each voltage domain, a non-switchable voltage line to which a supply potential of the semiconductor circuit can be fed is disposed.

25. The semiconductor circuit according to claim 21, wherein each first switch includes a transistor.

26. The semiconductor circuit according to claim 21, wherein the first supply potential is fed to a first terminal of the switch, a second terminal of the switch is connected to the second local switchable supply voltage line, and a control signal to switch the power supply of the voltage domain is applied to a control terminal of the switch.

27. The semiconductor circuit according to claim 21, wherein the first local switchable supply voltage lines to which the first supply potential is to be switched by switches that are connected to the same control signal are connected to each other via a further line.

28. The semiconductor circuit according to claim 21, wherein each first switch is a NMOS or NFET transistor.

29. The semiconductor circuit according to claim 21, wherein each first switch is a PMOS or PFET transistor.

30. The semiconductor circuit according to claim 21, wherein non-switchable lines to which a supply potential of the semiconductor circuit can be fed are disposed evenly over the semiconductor circuit.

31. The semiconductor circuit according to claim 21, wherein two rows or columns of the semiconductor circuit, of which the first power supply in each case is to be switched by a first switch, and which are arranged adjacently in the semiconductor circuit, are arranged in mirror symmetry to each other regarding supply voltage lines and regarding the first switch.

32. The semiconductor circuit according to claim 21, wherein the semiconductor circuit includes standard cells, the first voltage domain and the first switch being constructed of the standard cells.

33. The semiconductor circuit according to claim 32, wherein the standard cells are arranged in a row or column, each of the row or column being connected to a first supply potential and a second supply potential of the semiconductor circuit.

* * * * *